United States Patent
Coy et al.

(10) Patent No.: US 6,775,635 B1
(45) Date of Patent: Aug. 10, 2004

(54) SYSTEM AND METHOD FOR MEASURING AMPLIFIER GAIN IN A DIGITAL NETWORK

(75) Inventors: Bruce Harrison Coy, San Diego, CA (US); Hongming An, San Diego, CA (US); Shyang Kye Kong, San Diego, CA (US)

(73) Assignee: Applied MicroCircuits Corporation, San Diego, CA (US)

(*) Notice: Subject to any disclaimer, the term of this patent is extended or adjusted under 35 U.S.C. 154(b) by 66 days.

(21) Appl. No.: 10/217,209

(22) Filed: Aug. 12, 2002

(51) Int. Cl.$^7$ ............... G01R 35/00; G06F 19/00
(52) U.S. Cl. ............................................. 702/107
(58) Field of Search .................. 702/57, 64, 107, 702/109, 117, 118, 120, 183, 185; 327/306, 307

(56) References Cited

U.S. PATENT DOCUMENTS 6,617,905 B1 * 9/2003 An et al. .................. 327/307

* cited by examiner

*Primary Examiner*—Michael Nghiem
(74) *Attorney, Agent, or Firm*—Law Office of Gerald Maliszewski; Gerald Maliszewski

(57) ABSTRACT

A system and method are provided for measuring amplifier gain in a digital network. The method includes accepting a digital input signal; amplifying the input signal (Vin); comparing the amplified signal to dc thresholds; measuring output errors; and, calculating the amplifier gain in response to the thresholds. More specifically, accepting a digital input signal includes accepting an input signal having an amplitude. Comparing the amplified signal to dc thresholds includes comparing the amplified signal to a low threshold and a high threshold. Measuring errors includes measuring a predetermined error condition in response to the high threshold and the low threshold. Then, calculating the amplifier gain in response to the thresholds includes calculating the amplifier gain in response to the high threshold, the low threshold, and the input signal amplitude.

21 Claims, 2 Drawing Sheets

SYSTEM AND METHOD FOR MEASURING AMPLIFIER GAIN IN A DIGITAL NETWORK

BACKGROUND OF THE INVENTION

1. Field of the Invention

This invention generally relates to system gain measurement techniques and, more particularly, to a system and method for measuring amplifier gain in a digital network receiver front-end.

2. Description of the Related Art

FIG. 1 is a schematic diagram of a conventional digital receiver front-end (prior art). The digital receiver is designed to receive a wide dynamic range input signal. Even if the format of the signal is digital, the wide dynamic range of the input signal gives it characteristics of an analog signal. The purpose of the amplifier is to supply an amplified output signal to an interfacing comparator. If the amplifier gain is too small, the signal may be too small to properly trigger the comparator. Too much gain may result in an amplified signal becoming saturated or distorted, so that it will also be unable to properly trigger the comparator. Either way, improper amplification can result in a bit of information being misinterpreted.

Due to fabrication process tolerances, the exact gain of the amplifier can vary. Therefore, the amplifier gain is monitored. If the signal strength is small, the amplifier gain is increased to optimize the drive level to the interfacing comparator. If the input signal strength is too large, the amplifier gain is minimized to provide the optimal drive to the comparator. However, this approach requires that an integrated circuit (IC) pin be dedicated to monitoring the amplifier output. As the size of ICs decreases, and their functionality increases, it becomes difficult to justify the dedication of a pin to any particular purpose.

Alternately, the receiver front-end may include an automatic gain control (AGC) circuit (not shown). However, AGC circuitry is complicated and can be difficult to calibrate. In other aspects (not shown), the amplifier gain is not monitored, but set assuming a predetermined gain and input signal amplitude. The simplicity of this approach is offset by the degradation of network performance in situations where the actual gain differs from the assumed gain.

It would be advantageous if the gain of a digital receiver front-end amplifier could be determined without having to directly monitor the amplifier output via a dedicated IC pin.

It would be advantageous if the gain of a digital receiver front-end amplifier could be optimized by analyzing the output of the interfacing comparator circuit.

SUMMARY OF THE INVENTION

The present invention provides a system and method for determining the gain of a digital receiver front-end amplifier, without having to dedicate an IC pin for directly monitoring the amplifier output. The present invention simplifies the design of a digital receiver network, without degrading receiver sensitivity.

Accordingly, a method is provided for measuring amplifier gain in a digital network. The method comprises: accepting a digital input signal (Vin); amplifying the input signal; comparing the amplified signal to dc thresholds; measuring output errors; and, calculating the amplifier gain in response to the thresholds.

More specifically, accepting a digital input signal includes accepting an input signal having a predetermined (or measured) amplitude. Comparing the amplified signal to dc thresholds includes comparing the amplified signal to a low threshold and a high threshold. Measuring errors includes measuring a predetermined error condition in response to the high threshold and the low threshold. Then, calculating the amplifier gain in response to the thresholds includes calculating the amplifier gain in response to the high threshold, the low threshold, and the input signal amplitude.

Additional details of the above-described method, and a system for measuring amplifier gain in a digital network are provided below.

DETAILED DESCRIPTION OF THE PREFERRED EMBODIMENTS

Figure 1:
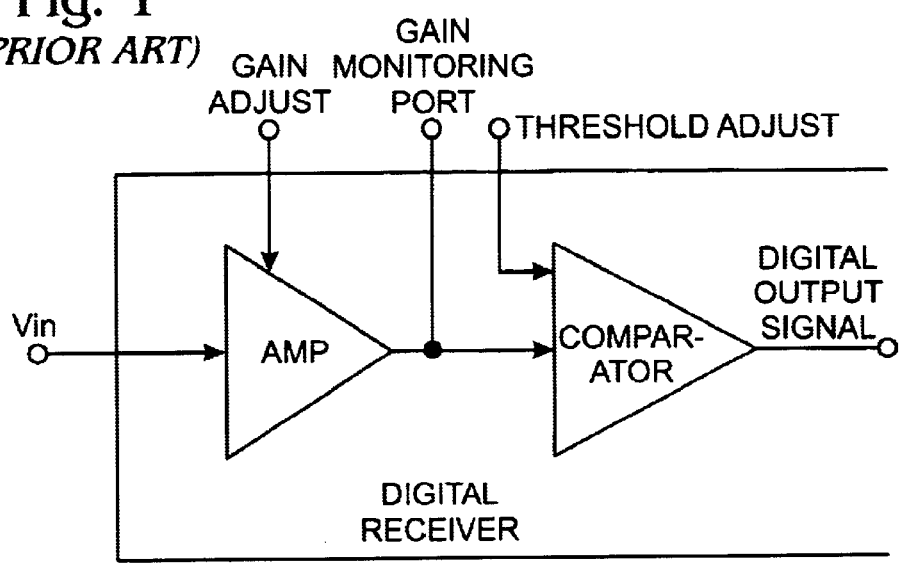
FIG. 1 is a schematic diagram of a conventional digital receiver front-end (prior art).
Figure 2:
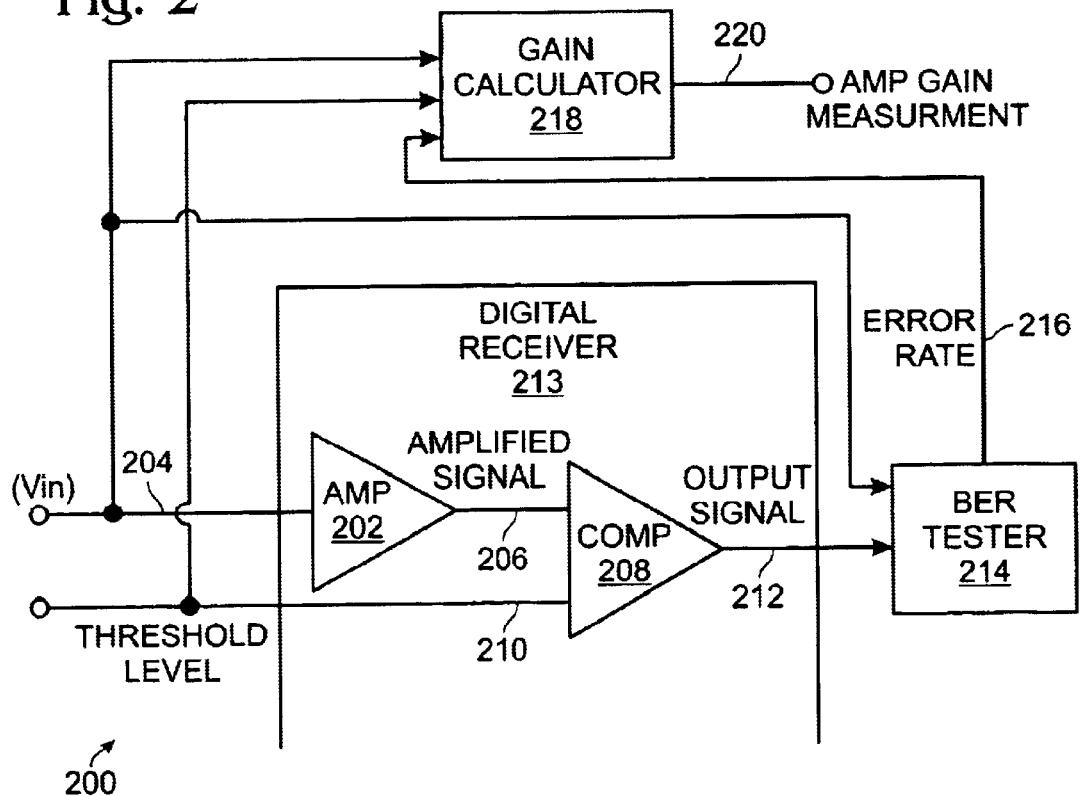
FIG. 2 is a schematic block diagram of the present invention system for measuring amplifier gain in a digital network.

FIG. 2 is a schematic block diagram of the present invention system for measuring amplifier gain in a digital network. The system 200 comprises an amplifier 202 having an input on line 204 to receive a digital input signal (Vin) and an output on line 206 to supply an amplified signal. Note that although only a single amplifier is shown for simplicity, the present invention system is applicable for use in the measurement of a plurality of amplifiers, or cascaded amplifiers. A comparator 208 has an input on line 206 to accept the amplified signal, an input on line 210 to accept a dc threshold level (Vth), and an output on line 212 to supply an output signal. For example, the comparator supplies a digital high in response to the amplified output signal exceeding the threshold level, and a digital low in response to the amplified signal being less than the threshold level. Typically, the amplifier 202 and comparator 208 are part of a digital receiver 213.

A bit error rate (BER) tester 214 has an input on line 212 to accept the output signal and an output on line 216 to supply an error rate. A gain calculator 218 has an input on line 210 to receive the threshold level, and input on line 216 to receive the error rate, and an output on line 220 to supply an amplifier gain measurement.

In operation, the comparator 208 receives a low threshold (Vth1) on line 210 and the BER tester 214 measures a first error condition in response to the low threshold. Then, the comparator 208 receives a high threshold (Vth2) on line 210 and the BER tester 214 measures the first error condition in response to the high threshold. The gain calculator 218 calculates the amplifier gain in response to the low and high thresholds.

Figure 3:
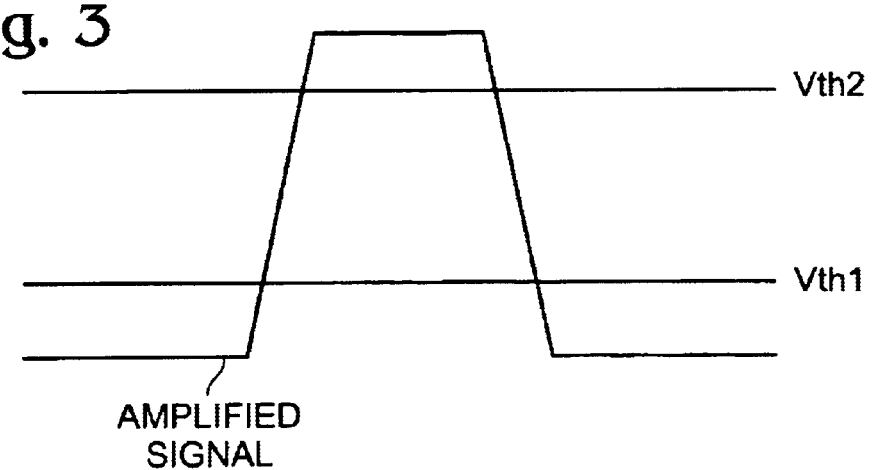
FIG. 3 is an exemplary signal diagram of the comparator input signals.

FIG. 3 is an exemplary signal diagram of the comparator input signals. The threshold is initially lowered until a predetermined (first) error condition is obtained, as measured by the BER tester. This threshold level is defined as Vth1. Then, the threshold is increased until the same error condition is obtained. This threshold level is defined as Vth2. The gain calculator also has an input (see FIG. 2) to accept the input signal amplitude measurement. The gain calculator 218 calculates the amplifier gain in response to the high threshold, the low threshold, and the input signal amplitude. As shown in FIG. 2, an assumption is made that the gain calculator performs the input signal amplitude measurement. However, in other aspects of the invention (not shown), additional external circuitry is used to measure the input signal amplitude on line 204 and that measurement is supplied to the gain calculator 218 on an independent line. Note that the threshold determination process may be reversed with the same results, with the high threshold (Vth2) being determined before the low threshold (Vth1)

The gain calculator 218 calculates the amplifier gain as follows:

$$G=(Vth2-Vth1)Vin.$$

In some aspects of the system, the BER tester 214 has an input on line 204 to accept the input signal. Typically, the input signal follows a pseudorandom data pattern. Then, the BER tester 214 measures the error rate in response to comparing the input signal to the output signal. However, the invention is applicable to any type of information or test pattern. Alternately but not shown, there is no connection of the input signal to the BER tester 214, but the BER tester analyzes a known or predetermined pattern of input signal data against the output signal on line 212. For example, a pattern of alternating ones and zeros can be used.

In some aspects, the BER tester 214 measures a loss-of-lock condition as the first error condition. That is, Vth1 and Vth2 are found in response to the receiver entering a loss-of-lock condition. A loss-of-lock condition occurs in asynchronous communications when the data clock cannot be derived from the incoming data. Alternately, the BER tester 214 measures a particular bit error rate (BER) first error condition. For example, the BER tester can measure a BER such as $10^{-3}$ ($1 \times 10^{-3}$), $10^{-6}$, $10^{-9}$, or $10^{-12}$. However, the present invention system is not limited to any particular first error condition or BER.

The present invention system 200 is of particular interest for amplifier input signals with a data rate greater than 10 gigabits per second (Gbs). Likewise, the amplifier input signal amplitude is typically in the range between 5 millivolts (mV) and 1.5 V, peak to peak. However, the present invention system is not limited to any particular frequencies or signal strengths.

Figure 4:
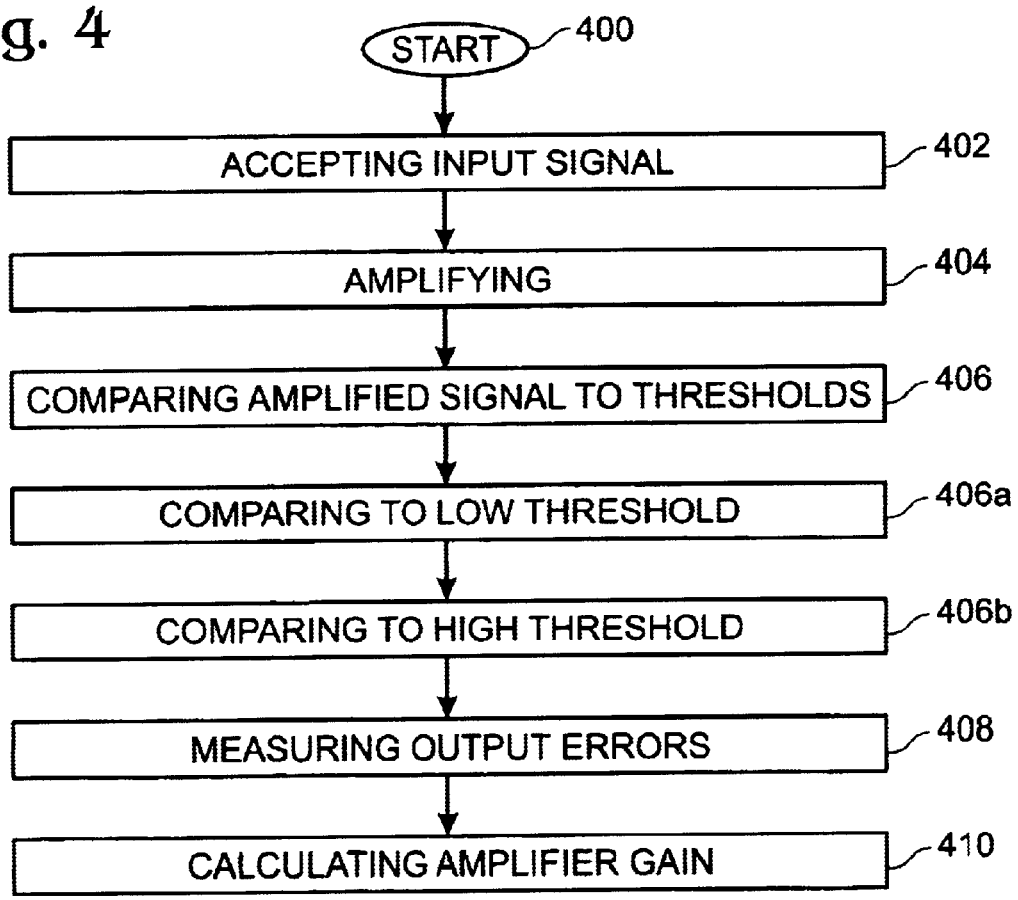
FIG. 4 is a flowchart illustrating the present invention method for measuring amplifier gain in a digital network.

FIG. 4 is a flowchart illustrating the present invention method for measuring amplifier gain in a digital network. It should be understood that some of these steps may be skipped, performed in parallel, or performed without the requirement of maintaining a strict order of sequence.

The method starts at Step 400. Step 402 accepts a digital input signal (Vin). Step 404 amplifies the input signal. Step 406 compares the amplified signal to dc thresholds. Step 408 measures output errors. Step 410 calculates the amplifier gain in response to the thresholds.

In some aspects of the method, comparing the amplified signal to dc thresholds in Step 406 includes substeps. Step 406a compares the amplified signal to a low threshold. Step 406b compares the amplified signal to a high threshold. Then, measuring errors in Step 408 includes measuring a predetermined error condition in response to the high threshold and the low threshold. Further, calculating the amplifier gain in response to the thresholds in Step 410 includes calculating the amplifier gain in response to the high and low thresholds.

In other aspects, accepting a digital input signal in Step 402 includes accepting an input signal having a predetermined amplitude. Then, calculating the amplifier gain in Step 410 includes calculating the amplifier gain in response to the high threshold, the low threshold, and the (predetermined) input signal amplitude. Alternately, the input signal strength is not predetermined. Instead, the method includes the additional step of measuring (not shown). Then, calculating the amplifier gain in Step 410 includes calculating the amplifier gain in response to the high threshold, the low threshold, and the (measured) input signal amplitude.

More specifically in some aspects, calculating the amplifier gain in response to the high threshold, the low threshold, and the input signal amplitude in Step 410 includes calculating the gain as follows:

$$G=(Vth2-Vth1)/Vin.$$

In other aspects of the method, accepting a digital input signal in Step 402 includes accepting an input signal with a data pattern. Then, measuring output errors in Step 408 includes comparing the output of the high and low threshold comparisons to the data pattern. In one instance, Step 408 measures a loss-of-lock condition. Alternately, Step 408 measures a particular bit error rate (BER), such as $10^{-3}$, $10^{-6}$, $10^{-9}$, or $10^{-12}$.

In some aspects, accepting a digital input signal in Step 402 includes accepting an input signal with a pseudorandom data pattern. In other aspects, an input signal with a data rate of greater than 10 gigabits per second (Gbs) is accepted. In yet other aspects, Step 402 accepts an input signal with an amplitude in the range between 5 mV and 1.5 V, peak to peak.

A system and method have been provided for measuring amplifier gain in a digital network. An example has been provided has to how the present invention can be applied to a specific problem. However, the invention is not limited to merely the recited example. Other variations and embodiments of the invention will occur to those skilled in the art.

We claim:

1. A method for measuring amplifier gain in a digital network, the method comprising:

accepting a digital input signal (Vin) having an amplitude;

amplifying the input signal;

comparing the amplified signal to a low threshold;

comparing the amplified signal to a high threshold;

measuring a predetermined error condition in response to the high threshold and the low threshold; and calculating the amplifier gain in response to the high and low thresholds and the input signal amplitude as follows:

$$G=(Vth2-Vth1)Vin.$$

2. The method of claim 1 further comprising:

measuring the input signal amplitude; and wherein calculating the amplifier gain in response to the high and low thresholds and the input signal amplitude includes calculating the amplifier gain in response to the high threshold, the low threshold, and the measured input signal amplitude.

3. The method of claim 1 wherein accepting a digital input signal includes accepting an input signal with a data pattern; and, wherein measuring digital output signal errors includes comparing the output of the high and low threshold comparisons to the data pattern.

4. The method of claim 3 wherein measuring digital output signal errors includes measuring a loss-of-lock condition.

5. The method of claim 3 wherein measuring digital output signal errors includes measuring a particular bit error rate (BER).

6. The method of claim 5 wherein measuring digital output signal errors includes measuring a BER selected from the group including $10^{-3}$, $10^{-6}$, $10^{-9}$, and $10^{-12}$.

7. The method of claim 3 wherein accepting a digital input signal includes accepting an input signal with a pseudorandom data pattern.

8. The method of claim 3 wherein accepting a digital input signal includes accepting an input signal with a data rate of greater than 10 gigabits per second (Gbs).

9. The method of claim 7 wherein accepting a digital input signal includes accepting an input signal with an amplitude in the range between 5 millivolts (mV) and 1.5 volts, peak to peak.

10. A method for measuring amplifier gain in a digital network, the method comprising:

accepting a digital input signal with an amplitude (Vin);

amplifying the input signal;

comparing the amplified signal to a low threshold (Vth1);

comparing the amplified signal to a high threshold (Vth2);

measuring a predetermined error condition in response to the high and low thresholds; and, calculating the amplifier gain as follows $$G=(V\text{th}2-V\text{th}1)/V\text{in}.$$

11. A system for measuring amplifier gain in a digital network, the system comprising:

an amplifier having an input to receive a digital input signal (Vin) and an output to supply an amplified signal;

a comparator having an input to accept the amplified signal, an input to accept a dc threshold level (Vth), and an output to supply an output signal;

a bit error rate (BER) tester having an input to accept the output signal and an output to supply an error rate; and, a gain calculator having an input to receive the threshold level, and input to receive the error rate, and an output to supply an amplifier gain measurement.

12. The system of claim 11 wherein the comparator receives a low threshold (Vth1);

wherein the BER tester measures a first error condition in response to the low threshold;

wherein the comparator receives a high threshold (Vth2);

wherein the BER tester measures the first error condition in response to the high threshold; and, wherein the gain calculator calculates the amplifier gain in response to the low and high thresholds.

13. The system of claim 12 wherein the gain calculator has an input to accept an input signal amplitude measurement; and, wherein the gain calculator calculates the amplifier gain in response to the high threshold, the low threshold, and the input signal amplitude.

14. The system of claim 13 wherein gain calculator calculates the amplifier gain as follows:

$$G=(V\text{th}2-V\text{th}1)V\text{in}.$$

15. The system of claim 14 wherein the BER tester has an input to accept the input signal, the BER tester measuring the error rate in response to comparing the input signal to the output signal.

16. The system of claim 15 wherein the BER tester measures a loss-of-lock first error condition.

17. The system of claim 15 wherein the BER tester measures a particular bit error rate (BER) first error condition.

18. The system of claim 17 wherein the BER tester measures a BER selected from the group including $10^{-3}$, $10^{-6}$, $10^{-9}$, and $10^{-12}$.

19. The system of claim 15 wherein the amplifier accepts an input signal with a pseudorandom data pattern.

20. The system of claim 15 wherein the amplifier accepts an input signal with a data rate greater than 10 gigabits per second (Gbs).

21. The system of claim 15 wherein the amplifier receives an input signal amplitude in the range between 5 millivolts (mV) and 1.5 volts, peak to peak.

* * * * *